(12) United States Patent
Yajima et al.

(10) Patent No.: US 9,574,833 B2
(45) Date of Patent: Feb. 21, 2017

(54) THERMAL CONDUCTIVE SHEET, METHOD OF PRODUCING THERMAL CONDUCTIVE SHEET AND HEAT RELEASING DEVICE

(75) Inventors: Michiaki Yajima, Hitachi (JP); Rei Yamamoto, Tsukuba (JP); Tooru Yoshikawa, Tsukuba (JP); Tomonori Seki, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 632 days.

(21) Appl. No.: 13/704,657

(22) PCT Filed: Apr. 25, 2011

(86) PCT No.: PCT/JP2011/060094
§ 371 (c)(1),
(2), (4) Date: Jan. 24, 2013

(87) PCT Pub. No.: WO2011/158565
PCT Pub. Date: Dec. 22, 2011

(65) Prior Publication Data
US 2013/0112389 A1    May 9, 2013

(30) Foreign Application Priority Data
Jun. 17, 2010   (JP) ................................. 2010-138488

(51) Int. Cl.
| | | |
|---|---|---|
| *B32B 15/06* | (2006.01) | |
| *B32B 15/08* | (2006.01) | |
| *B32B 27/18* | (2006.01) | |
| *F28F 21/02* | (2006.01) | |
| *C08K 3/04* | (2006.01) | |
| *C08K 7/24* | (2006.01) | |
| *F28F 21/08* | (2006.01) | |
| *H01L 23/373* | (2006.01) | |
| *C08K 5/523* | (2006.01) | |

(52) U.S. Cl.
CPC ............... *F28F 21/08* (2013.01); *B32B 15/06* (2013.01); *B32B 15/08* (2013.01); *B32B 27/18* (2013.01); *C08K 7/24* (2013.01); *F28F 21/02* (2013.01); *H01L 23/373* (2013.01); *B32B 2264/108* (2013.01); *C08K 3/04* (2013.01); *C08K 5/523* (2013.01); *H01L 2924/0002* (2013.01); *Y10T 156/1052* (2015.01)

(58) Field of Classification Search
None
See application file for complete search history.

(56) References Cited

U.S. PATENT DOCUMENTS

2004/0081843 A1    4/2004  Bunyan
2011/0061852 A1*   3/2011  Tashiro et al. ................ 165/185

FOREIGN PATENT DOCUMENTS

| CN | 1630075 A | 6/2005 |
|---|---|---|
| CN | 101508889 A | 8/2009 |
| EP | 2291066 A1 | 3/2011 |
| JP | 62-131033 | 6/1987 |
| JP | 4-246456 | 9/1992 |
| JP | 5-247268 | 9/1993 |
| JP | 10-298433 | 11/1998 |
| JP | 11-1621 | 1/1999 |
| JP | 2003-321554 | 11/2003 |
| JP | 2005-203735 | 7/2005 |
| JP | 2006-328213 A | 12/2006 |
| JP | 2010-132866 | 6/2010 |
| WO | WO 2009/142290 | 11/2009 |

OTHER PUBLICATIONS

CN Office Action of Appln. No. 2011800298157 dated Oct. 22, 2014 with partial English translation.
Written Opinion International Searching Authority of Appln. No. PCT/JP2011/060094 dated Aug. 2, 2011 with English translation.
Extended Search Report issued Dec. 9, 2015, by the European Patent Office in regards to Appln. No. 11795473.5 in English.
Office Action issued Feb. 2, 2016, by the State Intellectual Property Office of People's Republic of China in regards to Appln. No. 2011800298157 with partial English translation.

* cited by examiner

*Primary Examiner* — Sheeba Ahmed
(74) *Attorney, Agent, or Firm* — Fitch, Even, Tabin & Flannery LLP

(57) ABSTRACT

The thermal conductive sheet of the present invention includes a base sheet and, on one surface of the base sheet, a metal foil (C) that has a thickness of from 1 to 30% of a thickness of the base sheet. The base sheet includes a binder component (A) that exhibits elasticity at room temperature and a graphite powder (B) that has anisotropy, and the graphite powder (B) is oriented in a thickness direction.

8 Claims, No Drawings

THERMAL CONDUCTIVE SHEET, METHOD OF PRODUCING THERMAL CONDUCTIVE SHEET AND HEAT RELEASING DEVICE

TECHNICAL FIELD

The present invention relates to a thermal conductive sheet, a method of producing a thermal conductive sheet and a heat releasing device. More specifically, the present invention relates to a thermal conductive sheet that exhibits excellent heat transfer performance and handleabiliy, and has a processability that enables the thermal conductive sheet to compliant with the shape of a heat source and a heat releasing material to which the thermal conductive sheet is applied, a method of producing the thermal conductive sheet, and a heat releasing device using the thermal conductive sheet.

BACKGROUND

In recent years, there has been a rapid growth in the amount of information to be processed by electronic devices such as personal computers. As a result, a multilayer wiring board or a semiconductor, which plays an important role in the devices, has increased its density. Further, the size of an electronic member has increased. Under such circumstances, the amount of heat generated inside the device has become larger than that of conventional devices, thereby causing problems such as miscalculation or loss of control of a computer during operation.

In order to solve the problems as set forth above, electronic device manufactures have been taking actions, with the aim of achieving rapid cooling the interior of an electronic device, such as: (1) positioning a cooling fan having higher performances than ever; (2) increasing heat releasing properties of a heat source by positioning, between the heat source and the heat releasing material, a thermal conductive material that is highly heat-conductive and flexible. However, employing a high-performance cooling fan causes an increase in size of an electronic device, and also an increase in noise and cost.

In view of the above, a heat transfer material, which is provided between a heat source and a heat releasing material, has been attracting attention. A heat transfer material is required that it has a thickness of as small as possible, exhibits excellent heat conductivity, and that it can follow deformation of the heat source or the heat releasing material.

Representative examples of the heat transfer material include grease-type materials. However, the method affects workability during assembling of a heat releasing device due to its poor handleability that is attributed to low viscosity. Further, since a grease generally greatly changes its viscosity due to changes in temperature, there is a problem in terms of changes in heat transfer characteristics.

Therefore, a thermal conductive sheet, which has elasticity and is stable in surface tackiness, has been attracting attention as a material that has improved workability compared with grease-type heat transfer materials.

However, since thermal conductive sheets that are currently available in the market are inferior in the balance of heat releasing performances (effect of cooling a heat source), handleability and sheet properties (elasticity and surface tackiness), improvement in these properties has been desired. Further, although a sheet made of indium has been available as a heat releasing metallic material, the use thereof is limited due to its high cost.

Under such circumstances, various kinds of composite materials and processed materials thereof, which are low in cost and exhibit excellent heat releasing properties and workability, have been proposed.

For example, a molded product of a heat releasing resin in which a graphite powder is mixed with a thermoplastic resin (see, for example, Japanese Patent Application Laid-Open (JP-A) No. 62-131033) and a polyester resin composition including graphite, carbon black or the like (see, for example, JP-A No. 4-246456) have been disclosed. Further, a rubber composition in which artificial graphite having a particle size of from 1 to 20 µm is mixed (see, for example, JP-A No. 5-247268) and a composition in which a powder of spheroidal graphite having a crystal surface interval of from 0.330 to 0.340 nm is mixed with a silicone rubber (see JP-A No. 10-298433) have been disclosed.

In addition, a highly heat-releasable composite material in which specific graphite particles are aligned in parallel to the surface of a composition by compressing by applying a pressure in a solid, and a method of producing the material (see, for example, JP-A No. 11-001621) have been disclosed. Further, a heat-releasable molded material in which the c-axis of the crystal structure of a graphite powder in the molded material is oriented in a direction orthogonal to a direction in which heat is released, and a method of producing the molded material has been disclosed (see, for example, JP-A No. 2003-321554).

A thermal conductive sheet that can be readily handled has a feature that assembling of a heat releasing device is easily carried out. In a method of using a thermal conductive sheet in which this feature is further utilized, there has been demand for the thermal conductive sheet to acquire functions such as a shape processability in accord with the shape of a heat releasing material, an ability of following a specific shape such as a rough or warpage of a heat source or a heat releasing material, and a stress relaxation. For example, in a case of releasing heat from a large area, such as a display panel, exhibition of such functions has been an important issue. Accordingly, development of a sheet that can be readily handled and shape-processed, and is highly heat conductive, has been strongly demanded.

DISCLOSURE OF THE INVENTION

Problems to be Solved by the Invention

The problem to be solved by the invention is to provide a thermal conductive sheet that is highly heat conductive and handleable, and processable into various shapes according to usage, a method of the thermal conductive sheet, and a heat transfer device using the thermal conductive sheet.

Means for Solving the Problem

The inventors have made intensive studies in view of solving the problems as set forth above and, as a result, have invented a thermal conductive sheet that exhibits excellent heat transfer characteristics, handleability and shape-processability by allowing an anisotropic graphite powder to be oriented in one direction in a binder component, and applying a metal foil having a specific thickness to a surface of the sheet.

Specifically, the present invention is as follows.

<1> A thermal conductive sheet including:
a base sheet that contains a binder component (A) that exhibits elasticity at room temperature and a graphite powder (B) that has anisotropy, the graphite powder (B) being oriented in a thickness direction; and a metal foil (C) that has a thickness of from 1 to 30% of a thickness of the base sheet, the metal foil (C) being positioned on one surface of the base sheet.

<2> The thermal conductive sheet according to <1>, in which the metal foil (C) is formed from aluminum, copper or tin.

<3> The thermal conductive sheet according to <1> or <2>, including, as the binder component (A), a thermoplastic rubber component (D) that has a glass transition temperature of 50° C. or less.

<4> The thermal conductive sheet according to any one of <1> to <3>, including, as the binder component (A), a thermoplastic rubber component (D) that has a glass transition temperature of 50° C. or less, a thermosetting rubber component (E), and a thermosetting rubber curing agent (F) that is crosslinkable with the thermosetting rubber component (E).

<5> The thermal conductive sheet according to any one of <1> to <4>, in which the graphite powder (B) is a powder obtained by crushing a molded sheet of expanded graphite, and in which a bulk density of the molded sheet of expanded graphite before crushing is in a range of from 0.1 $g/cm^3$ to 1.5 $g/cm^3$.

<6> The thermal conductive sheet according to any one of <1> to <5>, in which the graphite powder (B) has a flat and acicular shape or a dendritic shape, and has an average particle size of from 50 μm to 2000 μm.

<7> The thermal conductive sheet according to any one of <1> to <6>, further including a phosphoric acid ester.

<8> A method of producing the thermal conductive sheet according to any one of <1> to <7>, the method including:

a process of preparing a composition that includes the binder component (A) that exhibits elasticity at room temperature and the graphite powder (B) that has anisotropy;

a process of producing, from the composition, a primary sheet in which the graphite powder (B) is oriented in a direction parallel to the main surface;

a process of producing a molded material by layering or rolling the primary sheet;

a process of producing a base sheet by slicing the molded material at an angle of from 45 to 80° with respect to the normal line from the primary sheet surface; and a process of providing, on the surface of the base sheet, the metal foil (C) that has the thickness of from 1 to 30% of the thickness of the base sheet.

<9> The method of producing the thermal conductive sheet according to <8>, in which the binder component (A) includes a tackifier, the thermoplastic rubber component (D), the thermosetting rubber component (E) and the thermosetting rubber curing agent (F) that is crosslinkable with the thermosetting rubber component (E), and in which the method includes crosslinking the binder component (A) before or after the process of providing the metal foil (C) onto the surface of the base sheet.

<10> A heat releasing device including:

a heat source;

a heat releasing material; and the thermal conductive sheet according to any one of <1> to <7> that is positioned between the heat source and the heat releasing material such that the thermal conductive sheet contacts both the heat source and the heat releasing material.

EFFECT OF THE INVENTION

According to the present invention, it is possible to provide a thermal conductive sheet that exhibits excellent heat transfer characteristic (heat conductivity), handleability (strength and tackiness) and shape-processability (stress relaxation).

BEST MODE FOR IMPLEMENTING THE INVENTION

<Thermal Conductive Sheet>

The thermal conductive sheet of the present invention includes:

a base sheet that includes a binder component (A) that exhibits elasticity at room temperature (hereinafter, also abbreviated as a "binder component (A)") and a graphite powder (B) that has anisotropy (hereinafter, also abbreviated as a "graphite powder (B)"), the graphite powder (B) being oriented in a thickness direction; and a metal foil (C) that has a thickness of from 1 to 30% of a thickness of the base sheet, the metal foil (C) being positioned on one surface of the base sheet.

By having the structure as described above, handleability of the thermal conductive sheet can be improved while maintaining its heat transfer characteristic.

By providing the metal foil (C) that has a thickness as specified above, the strength of the thermal conductive sheet is improved and its processing in accordance with the shape or design of the heat releasing material becomes possible, and handleability during assembling is improved. In addition, by allowing the anisotropic graphite powder (B) to be oriented in a thickness direction, heat conductivity of the thermal conductive sheet in a thickness direction of the thermal conductive sheet is improved and, when the thermal conductive sheet is provided between the heat source and the heat releasing material, heat from the heat source can be efficiently transferred to the heat releasing plate.

In the present invention, a graphite powder "that has anisotropy" refers to a graphite powder that has anisotropy in terms of heat conductivity, and has an aspect ratio (short axis and long axis) in terms of its shape.

In the following, the "graphite powder having anisotropy" may also be referred to as "anisotropic graphite powder".

The expression that the anisotropic graphite powder (B) "is oriented in a thickness direction of the sheet" refers to a state in which, when the thermal conductive sheet is cut into a regular octagon shape and each cross section in a thickness direction at each side of the regular octagon is observed with a fluorescence microscope, the average value of angles formed between the long axes of any 50 particles of the anisotropic graphite powder (B) and the surface of the thermal conductive sheet (when the angle is 90° or more, the supplementary angle is used) is in a range of from 60 to 90° at any one of the cross sections.

The expression "exhibits elasticity at room temperature" refers to exhibiting elasticity at 25° C.

It is preferred that the binder component (A) and the anisotropic graphite powder (B) are adequately mixed with each other.

In the following, the materials that form the thermal conductive sheet of the present invention are explained.

(Binder Component (A))

The thermal conductive sheet of the present invention includes the binder component (A) that exhibits elasticity at room temperature, and the anisotropic graphite powder (B) described later is oriented in a thickness direction of the sheet in the binder component (A).

There is no restriction on the binder component (A) as long as it exhibits elasticity at room temperature, but a thermoplastic rubber component (D) that has a glass transition temperature of 50° C. or less is preferred, and the glass transition temperature is more preferably from −70° C. to 20° C., and further preferably from −60° C. to 0° C. When the glass transition temperature is 50° C. or less, elasticity is excellent and adhesiveness with respect to the metal foil (C), the heat source and the heat releasing material is favorable. The glass transition temperature (Tg) is measured with a differential scanning calorimeter (DSC).

There is no restriction on the thermoplastic rubber component (D), and examples thereof include acrylic rubber obtained by copolymerization of an acrylic acid ester (such as ethyl acrylate, butyl acrylate and 2-ethylhexyl acrylate) with another monomer, ethylene-propylene rubber obtained by reacting ethylene and propylene with a catalyst, butyl rubber obtained by copolymerization of isobutylene and isoprene, styrene butadiene rubber obtained by copolymerization of butadiene and styrene, and NBR obtained from acrylonitrile and butadiene.

The thermoplastic rubber component (D) is used singly or in the form of a composite. The weight average molecular weight of the thermoplastic rubber component (D) is preferably from 100,000 to 2,000,000, and more preferably from 200,000 to 1,500,000. When the weight average molecular weight is 100,000 or more, reduction in the glass transition temperature of the finally obtained base sheet is suppressed, and fluctuation in physical properties of the thermal conductive sheet caused by changes in temperature inside the electronic device is suppressed, whereby fluctuation in heat transfer characteristics is suppressed. When the weight average molecular weight of the thermoplastic rubber component (D) is 2,000,000 or less, mixability with the anisotropic graphite powder (B) is improved, and tackiness and elasticity are excellent.

The content of the thermoplastic rubber component (D) is not specifically restricted, but is preferably from 5 parts by mass to 70 parts by mass, and more preferably from 5 parts by mass to 60 parts by mass, with respect to 100 parts by mass of the base sheet. When the content is within the range, sheet characteristics as mentioned above are maintained.

Specific examples of the thermoplastic rubber component (D) include, as acrylic rubbers, THR-811DS (trade name, weight average molecular weight: 500,000, manufactured by Nagase ChemteX Corporation); THR-811DR (trade name, weight average molecular weight: 500,000, manufactured by Nagase ChemteX Corporation); NIPOL AR31 (trade name, manufactured by ZEON Corporation); NIPOL AR51 (trade name, manufactured by ZEON Corporation); NIPOL AR71 (trade name, manufactured by ZEON Corporation); NIPOL AR32 (trade name, manufactured by ZEON Corporation); and NIPOL AR42W (trade name, manufactured by ZEON Corporation).

Generally, a thermal conductive sheet is sandwiched between a heat source and a heat releasing plate, and used in a state in which a constant pressure is applied and the temperature changes under the usage environment. Therefore, it is preferred to use a thermosetting rubber component (E) as a binder component (A), in addition to the thermoplastic rubber component (D), in order that a thermal conductive sheet can withstand a pressure applied under the usage environment. By using a thermoplastic rubber component (D) and a thermosetting rubber component (E) in combination, handleability of the thermal conductive sheet can be further improved.

In the present invention, the "thermosetting rubber component (E)" refers to a component before curing, and it becomes a cured component by subjecting to a heat treatment with a thermosetting rubber curing agent (F).

In the present invention, by allowing the thermosetting rubber component (E) to crosslink with the thermosetting rubber curing agent (F), it becomes possible to reduce the amounts of changes in the molecular chain motion caused by the temperature under which the thermal conductive sheet is used, improve handleability (improve strength), and achieve stable heat transfer characteristics against a rapid change to the higher temperature side under the usage environment.

There is no particular restriction on the thermosetting rubber component (E) used in the present invention, as long as it is a modified synthetic rubber having a functional group that can crosslink with the thermosetting rubber curing agent (F). When selecting the thermosetting rubber component (E), selection of the type of the thermosetting rubber curing agent (F) is an important factor.

The crosslinking of the thermosetting rubber component (E) according to the present invention is preferably designed such that the structure or the characteristics of the thermosetting rubber component (E) and the thermosetting rubber curing agent (F) to be incorporated are reflected to the characteristics of the base sheet obtained by the crosslinking, rather than simply considering an increase in the molecular weight, i.e., an increase in the sheet strength as a result of an increase in the molecular weight of the thermosetting rubber component (E) by crosslinking. Further, the thermosetting rubber component (E) preferably has a functional group that can crosslink with respect to the thermosetting rubber curing agent (F).

In consideration of the purposes as mentioned above, the functional group of the thermosetting rubber component (E) that reacts with the thermosetting rubber curing agent (F) is preferably a carboxyl group, a hydroxyl group, an amino group or the like, and the thermosetting rubber component (E) is preferably a modified synthetic rubber modified with the functional group as mentioned above. In particular, NBR, which is a copolymer of acrylonitrile, butadiene and methacrylic acid and has a carboxyl group, or an acrylic rubber obtained by copolymerization of butyl acrylate, acrylonitrile and acrylic acid, is preferred in terms of sheet characteristics and its cost.

The thermosetting rubber component (E) is preferably a combination of a component that is solid at room temperature (E1) and a component that is liquid at room temperature (E2). The component that is solid at room temperature (E1) has excellent strength and heat resistance, and the component that is liquid at room temperature (E2) has excellent flexibility. Therefore, a favorable balance between heat resistance and flexibility can be achieved by combining these components. The room temperature here refers to from 15° C. to 30° C.

The thermosetting rubber component that is solid at room temperature (E1) is preferably a modified synthetic rubber that is modified with at least one of a carboxyl group, a hydroxyl group, an amino group or the like, and a solid carboxyl group-modified synthetic rubber is further preferred.

The thermosetting rubber component that is liquid at room temperature (E2) is preferably a modified synthetic rubber that is modified with at least one of a carboxyl group, a hydroxyl group, an amino group or the like, and a liquid carboxyl group-modified synthetic rubber is further preferred.

The molecular weight of a carboxyl group-modified solid rubber (E1), which is preferably used, is not particularly restricted, but the weight average molecular weight is preferably 100,000 or more, and more preferably from 150,000 to 500,000.

The molecular weight of a carboxyl group-modified liquid rubber (E2), which is preferably used, is not particularly restricted, but the weight average molecular weight is preferably 90,000 or less, and more preferably from 30,000 to 90,000.

The carboxyl group-modified solid rubber (E1) and the carboxyl group-modified liquid rubber (E2) may be used singly or as a mixture, respectively. When these rubbers are used as a mixture, the mixing ratio is arbitrarily determined depending on the desired characteristics. When the amount of the thermosetting rubber component that is solid at room temperature (E1) is increased, strength and heat resistance tend to be increased, whereas when the amount of the thermosetting rubber component that is liquid at room temperature (E2) is increased, flexibility tends to be increased.

Specific examples of the thermosetting rubber component that is solid at room temperature (E1) include carboxyl group-modified NBR (trade name: NIPPOL 1072, weight average molecular weight: 250,000, carboxyl group concentration: 0.75 (KOH mg/g), manufactured by ZEON Corporation).

Specific examples of the thermosetting rubber component that is liquid at room temperature (E2) include carboxyl group-modified NBR (trade name: NIPPOL DN601, weight average molecular weight: 68,000, carboxyl group concentration: 0.75 (KOH mg/g), manufactured by ZEON Corporation), X750, X740, X146 and X160 (manufactured by JSR Corporation).

The amount of the thermosetting rubber component (E) is preferably from 10 to 70 parts by mass, and preferably from 10 to 60 parts by mass, with respect to the total amount of 100 parts by mass of the thermoplastic rubber component (D) and the thermosetting rubber component (E) in the binder component (A). When the amount is within the range, a thermal conductive sheet with a favorable balance tends to be obtained.

It is also possible to employ a method in which a modified synthetic rubber having a hydroxyl group, as a thermosetting rubber component (E), and an isocyanate compound (NCO), as a thermosetting rubber curing agent (F), are used in combination. However, since an isocyanate compound also reacts instantly with water, it is preferred to use a compound other than an isocyanate compound from the viewpoint of handling and controlling reaction.

There is no particular restriction on the thermosetting rubber curing agent (F) used in the present invention.

It is also possible to use an ordinary compound such as sulfur, sulfur compounds or peroxides as the thermosetting rubber curing agent (F) that functions as a crosslinking (vulcanizing) agent of rubber. However, in consideration of environment (odor), safety and health and maintaining crosslinkability with rubber, a thermosetting rubber curing agent (F) that readily reacts with a functional group of the thermosetting rubber component (E), such as a carboxyl group, a hydroxyl group or an amino group, and has stable properties, is preferred.

When a carboxyl group-modified synthetic rubber or an amino group-modified synthetic rubber is used as the thermosetting rubber component (E) is used, the thermosetting rubber curing agent (F) is preferably an epoxy group-containing compound, more preferably an epoxy group-containing compound having two or more epoxy groups. The epoxy group-containing compound also has functions to improve adhesiveness of the thermal conductive sheet with respect to other members or heat resistance, and improve mixability of the binder component (A) and the anisotropic graphite powder (B). Therefore, the thermal conductive sheet in which an epoxy group-containing compound is used exhibits properties that partly reflect the characteristics of the epoxy group-containing compound.

The molecular weight and the structure of the epoxy group-containing compound used in the present invention is not particularly restricted, but is preferably an epoxy group-containing compound formed from epichlorohydrin having a number average molecular weight (Mn) of 500 or less and bisphenol A, in consideration of miscibility with the thermoplastic rubber component (D) and the thermosetting rubber component (E), heat resistance, cost and the like.

In particular, when the thermosetting rubber component (E) is a carboxyl group-modified synthetic rubber or an amino group-modified synthetic rubber, the ratio of the epoxy group-containing compound as the thermosetting rubber curing agent (F) is determined based on the concentration of the carboxyl group or the amino group included in the thermosetting rubber component (E), and the molecular weight of the epoxy group-containing compound and the number of epoxy groups (equivalent). Generally, it is preferred to mix from 1 to 30 parts by mass of the epoxy group-containing compound with respect to 100 parts by mass of the carboxyl group-modified synthetic rubber or the amino group-modified synthetic rubber. When the amount of the epoxy group-containing compound is 1 part by mass or more, crosslinking density via the epoxy group-containing compound is improved, and tackiness and mixability of the binder component (A) with the anisotropic graphite powder (B) is improved. When the amount of the epoxy group-containing compound is 30 parts by mass or less, the total of the epoxy group-containing compound fully contributes to crosslinking, thereby improving heat resistance or sheet characteristics.

Further, as necessary, a curing promoter such as an isocyanate compound or an amine compound is used.

The thermosetting rubber curing agent (F) and the thermosetting rubber component (E) are preferably reacted via a heat treatment. The conditions for the heat treatment are not particularly restricted, but full curing is achieved by 150° C./60 minutes. The state of full curing can be determined by confirming complete disappearance (IR) of the functional group such as a carboxyl group, a hydroxyl group or an amino group. Therefore, in order to reduce the curing stress in the thermal conductive sheet, the heat treatment is performed at low temperature for a long time, and in order to increase the productivity, the heat treatment is performed at high temperature for a short time.

The crosslinking density obtained by crosslinking of the thermosetting rubber curing agent (F) and the thermosetting rubber component (E) can be arbitrarily set depending on the heat treatment conditions. Since it is possible to change the crosslinking density of the thermosetting rubber component (E) and the thermosetting rubber curing agent (F) in the binder component (A) by the heat treatment conditions, it is possible to provide a thermal conductive sheet having properties that meet the desired requirements.

For example, in the thermal conductive sheet of the present invention, when priority is placed on tackiness of the heat source and the heat releasing plate, there is a method in which a heat source and a heat releasing material are attached to a thermal conductive sheet without performing a heat treatment, and then the thermosetting rubber component (E) and the thermosetting rubber curing agent (F) are cured by performing a heat treatment.

Further, when it is desired to further improve the adhesiveness between the base sheet and the metal foil (C) to be described later, there is a method in which a base sheet is produced without performing a heat treatment and a metal foil (C) is applied thereto, and then the thermosetting rubber component (E) and the thermosetting rubber curing agent (F) are cured by performing a heat treatment.

In a case in which a base sheet or a thermal conductive sheet is formed without performing a heat treatment and subsequently a heat treatment is performed, an adhesion promoter is preferably added to the binder component (A). Examples of the adhesion promoter include a tackifier, and commercial products thereof include SUPER ESTER A-75 (manufactured by Arakawa Chemical Industries, Ltd.), ESTER GUM AA-L (manufactured by Arakawa Chemical Industries, Ltd.), and PENSEL A (manufactured by Arakawa Chemical Industries, Ltd.)

When productivity is more important than tackiness, there is a method in which a heat treatment is performed upon production of a base sheet or a thermal conductive sheet, whereby the thermosetting rubber component (E) and the thermosetting rubber curing agent (F) in the binder component (A) are cured, thereby fixing between the heat source and the heat releasing plate by means of the tackiness of the thermoplastic rubber component (D) dispersed in the binder component (A).

In any case, the thermosetting rubber component (E) and the thermosetting rubber curing agent (F) are cured prior to using the thermal conductive sheet of the present invention as a heat releasing material. However, as mentioned above, the crosslink density of the thermal conductive sheet prior to be used as a heat releasing material can be changed depending on the desired requirements.

(Graphite Powder (B))

The thermal conductive sheet of the present invention includes a graphite powder (B) having anisotropy (anisotropic graphite powder). The anisotropic graphite powder is not specifically restricted as long as it functions as a heat releasing material, but is preferably a crushed powder of a molded sheet of expanded graphite. Further, the graphite powder (B) preferably has a flat and acicular shape or a dendritic shape.

The crushed powder of a molded sheet of expanded graphite can be prepared by, for example, by the following processes.

(1) Process of preparing expanded graphite.
(2) Process of preparing a molded sheet of expanded graphite from the expanded graphite.
(3) Process of crushing the molded sheet of expanded graphite.
(4) Process of classifying the particle size of the crushed powder.

In the process (1), the method of preparing expanded graphite is not particularly restricted. For example, it can be produced by generating a graphite intercalation compound by immersing natural graphite or the like as a raw material in a solution including an acidic material and an oxidant, and heating the graphite intercalation compound to expand the graphite crystal in the c-axis direction to obtain expanded graphite. In this way, expanded graphite having a structure in which worm-like short fibers are entangled in a complicate manner can be obtained.

The expansion magnification of expanded graphite is not particularly restricted, but is preferably 10 times or more, and further preferably from 50 times to 500 times, in consideration of heat releasing properties. When expanded graphite having an expansion magnification of 10 times or more is used, strength of the obtained molded sheet of expanded graphite is excellent, and when expanded graphite having an expansion magnification of 500 times or less is used, workability during preparation of the molded sheet of expanded graphite is excellent. Further, as necessary, it is also preferred to remove impurities included in the expanded graphite by subjecting the same to a heat treatment at even higher temperatures.

The raw material graphite for the expanded graphite is not particularly restricted, but preferred examples include graphites having highly grown crystals, such as natural graphite, kish graphite and thermally decomposed graphite. From the viewpoint of the obtained characteristics and economy, natural graphite is preferred. There is no restriction on the type of the natural graphite to be used, and commercial products such as F48C (manufactured by Nippon Graphite Industries, Ltd.) and H-50 (manufactured by Chuetsu Graphite Works, Co., Ltd.) can be used. These natural graphites are preferably used in a scaly form.

In the process (1), as the acidic substance used for the treatment of graphite, sulfuric acid or the like, which can enter a space between graphite layers and generate acidic roots (anions) that exhibits a sufficient ability of expansion, is used. Sulfuric acid as an acidic substance is used in an appropriate concentration, which is preferably 95% by mass or more, and strong sulfuric acid is particularly preferred. The amount of the acidic substance to be used is not particularly restricted, and determined depending of the intended expansion magnification. For example, the amount of the acidic substance is preferably from 100 to 1000 parts by mass with respect to 100 parts by mass of the raw material graphite.

The oxidant used together with the acidic substance is preferably a peroxide such as hydrogen peroxide, potassium perchlorate, potassium permanganate or potassium bichromate, or an acid having an ability of oxidation such as nitric acid. From the viewpoint of readily obtaining a favorable expanded graphite, hydrogen peroxide is particularly preferred.

When using hydrogen peroxide as an oxidant, it is preferably used as an aqueous solution. The concentration of hydrogen peroxide in the aqueous solution is not particularly restricted, but is preferably from 20 to 40% by mass. The amount of aqueous hydrogen peroxide is also not particularly restricted, but is preferably from 5 to 60 parts by mass with respect to 100 parts by mass of the raw material graphite.

In the process (2), the method of molding the expanded graphite into a sheet is not particularly restricted, and is easily carried out by rolling, pressing or the like at normal temperature. The bulkiness density of the molded sheet of expanded graphite is determined virtually by the packing amount of expanded graphite and the molding pressure.

The bulkiness density of the molded sheet of expanded graphite to be used is not particularly restricted, preferably from 0.07 g/cm$^3$ to 1.5 g/cm$^3$, and more preferably from 0.1 g/cm$^3$ to 1.5 g/cm$^3$. When the bulkiness density is 0.07 g/cm$^3$ or more, the strength of the molded sheet of expanded graphite is sufficient, and when the bulkiness density is 1.5 g/cm$^3$ or less, breakage of the aggregation of expanded graphite during molding can be suppressed.

The molded sheet of expanded graphite can be obtained by the method as mentioned above, or the following commercial products may be used. Examples of the commercially available molded sheet of expanded graphite include CARBOFIT HGP-105 and HGP-207 (manufactured by Hitachi Chemical, Co., Ltd.)

The apparatuses used in the processes (3) and (4) are not particularly restricted, and ordinary dry mill and dry classifier can be used to obtain an anisotropic graphite powder having a flat and acicular shape or a dendritic shape.

In the thermal conductive sheet of the present invention, when the shape of the anisotropic graphite powder (B) is spherical or close to spherical, contact among the particles of the anisotropic graphite powder (B), which is to be described later, tends to be mild and it becomes difficult to obtain a thermal conductive sheet having high heat conductivity. Therefore, an anisotropic graphite powder having a flat and acicular shape or a dendritic shape is preferred.

In the specification, the "flat and acicular shape" refers to a shape that resembles a flattened needle-like leaf of an acicular tree, and the "dendritic shape" refers to a shape resembling a tree having multiple branches that are tangled with each other. Determination of the shape is carried out with a SEM.

The average particle size ($D_{50}$) of the anisotropic graphite powder (B) is preferably from 50 μm to 2000 μm. When the average particle size of the anisotropic graphite powder (B) is 50 μm or more, anisotropy of the graphite powder, which determines the heat releasing characteristics, tends to be sufficient, and the probability of contact among the anisotropic graphite powder (B) is increased and the heat releasing characteristics tend to be improved. When the average particle size of the anisotropic graphite powder (B) is 2000 μm or less, the anisotropic graphite powder (B) is readily mixed with the binder component (A) uniformly, and the heat transfer characteristics and the physical properties of the thermal conductive sheet tend to be uniform.

The amount of the anisotropic graphite powder (B) in the base sheet is preferably from 20 to 70% by mass, and more preferably from 25 to 60% by mass, with respect to the total base sheet. When the amount of the anisotropic graphite powder (B) is 20% by mass or more, the heat releasing effect is sufficient, and when 70% by mass or less, the base sheet is prevented from becoming too hard.

(Other Components)

Other components used in the thermal conductive sheet of the present invention include a fire retardant, a plasticizer or the like. The fire retardant is not particularly restricted, but because it functions as a part of the binder component (A) of the base sheet, it is selected in consideration of compatibility with the binder component (A), heat resistance or physical properties of the obtained base sheet.

As the fire retardant, an ordinary halogenated compound can be used. In consideration of the balance of the sheet characteristics, a phosphoric acid ester-based fire retardant is preferred. Examples of the phosphoric acid ester-based fire retardant include aliphatic phosphoric acid ester such as trimethyl phosphate and triethyl phosphate, aromatic phosphoric acid ester such as triphenyl phosphate and tricresyl phosphate, and aromatic condensation-type phosphoric acid ester such as bisphenol A bis(diphenyl phosphate). These compounds may be used singly or in a combination of two or more.

One example of the phosphoric acid ester that can be used in the present invention is an aromatic condensation phosphoric acid ester (CR-741, manufactured by Daihachi Chemical Industry Co., Ltd.) or the like.

The amount of the fire retardant is preferably from 5 to 50 parts by mass with respect to 100 parts by mass of the binder component (A) of the thermal conductive sheet, and is appropriately determined depending on the amount of the anisotropic graphite powder (B). When the amount of the fire retardant is 5 parts by mass or more, intended flame retardant is readily obtained, and when 50 parts by mass or less, a rapid decrease in flexibility of the obtained thermal conductive sheet can be suppressed.

As the plasticizer, various kinds of low-molecular compounds may be used, and examples include polybutene (trade name: 0N, 3N, 5N, 10N, 30N, 200N, manufactured by NOF Corporation).

(Base Sheet)

The base sheet according to the present invention includes the binder component (A) and the anisotropic graphite powder (B), and the anisotropic graphite powder (B) is oriented in a thickness direction.

The thickness of the base sheet is preferably from 100 μm to 2000 μm, more preferably from 100 μm to 1500 μm, and further preferably from 100 μm to 1000 μm. When the thickness of the base sheet is within the range, handleability and heat transfer characteristics are excellent.

The thickness of the base sheet in the thermal conductive sheet of the present invention is defined as an average value of the values measured with a thickness gauge (average value of the values measured at any 5 points in the same base sheet). Examples of the thickness gauge include a digital dial gauge (DEGIMATIC INDICATOR ID-C112C, manufactured by Mitutoyo Co., Ltd.).

As described above, the base sheet may be a cured sheet obtained by curing by a heat treatment, or may be a sheet that is not crosslinked without a heat treatment.

The non-crosslinked base sheet may be subjected to a heat treatment after preparing a thermal conductive sheet by laminating a metal foil (C) to be described later, or after positioning the thermal conductive sheet between the heat source and the heat releasing material.

Details of the method of preparing the base sheet will be described later.

(Metal Foil (C))

In the present invention, the material of the metal foil (C) to be used may be appropriately selected according to the intended use. Among these, the material is preferably aluminum, copper or tin from the viewpoint of handleability and heat transfer characteristics.

The thickness of the metal foil (C) is from 1 to 30% of the thickness of the base sheet, more preferably from 1 to 25%, and further preferably from 1 to 20%. When the thickness of the metal foil (C) is 1% or less of the sheet thickness, an effect of improving handleability is insufficient, and when 30% or more, the sheet surface becomes hard and the heat transfer characteristics are lowered.

The thickness of the metal foil (C) in the thermal conductive sheet of the present invention is defined as an average value of the values measured with a thickness gauge (average value of the values measured at any 5 points in the same metal foil). Examples of the thickness gauge include a digital dial gauge (DEGIMATIC INDICATOR ID-C112C, manufactured by Mitutoyo Co., Ltd.).

The thickness of the metal foil (C) is from 1 to 30% of the thickness of the base sheet, and is preferably appropriately selected according to the intended use or the thickness of the base sheet. Specifically, the thickness of the metal foil (C) is preferably from 5 μm to 100 μm, more preferably from 5 μm to 90 μm, and further preferably from 5 μm to 80 μm. When the thickness of the metal foil (C) is within the range, handleability and heat transfer characteristics are excellent.

<Method of Producing Thermal Conductive Sheet>

In the method of producing a thermal conductive sheet, first, a base sheet that includes a binder component (A) and an anisotropic graphite powder (B), in which the anisotropic graphite powder (B) is oriented in a thickness direction, is prepared. Subsequently, a metal foil (C) having a thickness of from 1 to 30% of the thickness of the base sheet is provided on one surface of the base sheet.

More specifically, the method of producing the thermal conductive sheet includes the following processes.

(a) Process of preparing a composition including the binder component (A) and the anisotropic graphite powder (B).

(b) Process of preparing a primary sheet from the composition.

(c) Process of obtaining a molded material by layering or rolling the primary sheet.

(d) Process of obtaining a sliced sheet (base sheet) by slicing the molded material.

(e) Process of providing (laminating) the metal foil (C) to one surface of the sliced sheet (base sheet).

(Process (a))

First, a composition is obtained by mixing the binder component (A), the anisotropic graphite powder (B) and other components as appropriate.

There is no particular restriction on the method of mixing the binder component (A), the anisotropic graphite powder (B) and the other components, and a method in which the components can be mixed without changing the nature thereof, over a short time in a uniform manner. In particular, a method of mixing with a heated pressurized kneader is preferred.

The mixing conditions are appropriately determined depending on the molecular weight of the binder component (A) or the amount of the anisotropic graphite powder (B). In the ordinary order of placing the components into the kneader, when a high-molecular solid component and a low-molecular liquid component are used as the binder component (A), the solid component is placed in the kneader first, and the liquid component is gradually added while kneading the solid component. This method is effective since a uniform binder component (A) can be obtained.

If it is desired that the solid component and the liquid component are further uniformly mixed, it is possible that the solid component and the liquid component are uniformly mixed with a kneader or a roll (small amounts of other components may be mixed at this time), and the mixture is further mixed with other materials with a kneader.

In a case of using a thermosetting rubber component (E), if the viscosity of the composition is high and there is concern that the crosslinking reaction of the thermosetting rubber curing agent (F) and the thermosetting rubber component (E) is accelerated by friction heat generated during mixing, it is preferred to add the thermosetting rubber curing agent (F) to the kneader approximately 10 to 20 minutes before the completion of the mixing. Whether or not the mixing of the composition (including determination of progression of crosslinking of the thermosetting rubber curing agent (F)) is uniform is determined by measuring the viscosity of the composition with a curelastometer or a Mooney viscometer.

The intended viscosity is preferably determined by carrying out preliminary studies while changing the mixing temperature or the time in various formulation systems, and selecting the value of a thermal conductive sheet composition from which the intended properties were obtained. The intended viscosity of the composition mentioned herein refers to a viscosity that results only from the state of mixing of the anisotropic graphite powder (B) and the binder component (A) with substantially no effect due to curing reaction.

It is also possible to improve the mixability by adding a small amount of an organic solvent as necessary. In that case, the organic solvent is preferably removed eventually.

(Process (b))

Subsequently, a primary sheet is prepared from the composition obtained in the process (a).

Specifically, a preliminary sheet, in which the anisotropic graphite powder (B) is oriented in a direction substantially parallel to the main surface, is prepared by subjecting the composition obtained in the process (a) to a molding process such as rolling, pressing, extruding or coating. Among these, rolling or pressing is preferred because the anisotropic graphite powder (B) is readily and reliably oriented.

The state in which the anisotropic graphite powder (B) is oriented in a direction substantially parallel to the main surface of the sheet refers to a state in which the anisotropic graphite powder (B) is oriented along the main surface of the sheet. More specifically, it refers to a state in which the angle formed between the long axis of the anisotropic graphite powder (B) and the main surface of the sheet (when the angle is 90° or more, the supplementary angle is used) is in a range of from 0 to 45°. The direction of orientation of the anisotropic graphite powder (B) in the sheet plane is controlled by adjusting the direction in which the composition flows during the process of molding the composition.

The anisotropic graphite powder (B) is formed of particles having anisotropy. Therefore, when the composition is subjected to a molding process such as rolling, pressing, extruding or coating, the anisotropic graphite powder (B) is usually oriented in the same direction.

(Process (c))

Subsequently, a molded material is produced by layering or rolling the primary sheet obtained in the process (b).

The method of layering the primary sheet is not particularly restricted, and examples include layering plural primary sheets and a method of folding a single primary sheet.

When layering the primary sheet(s), it is carried out such that the anisotropic graphite powder (B) is oriented in the same direction in the sheet plane. The shape of the primary sheet to be layered is not particularly restricted. For example, a molded material having a rectangular column shape is obtained by layering primary sheets having a rectangular shape, and a molded material having a cylindrical column shape is obtained by layering primary sheets having a circular shape.

The method of rolling the primary sheet is not particularly restricted. For example, the primary sheet may be rolled with an axis that corresponds to the direction of orientation of the anisotropic graphite powder (B). The shape of the rolling is not particularly restricted, and may be a circular column shape or a rectangular column shape.

The molded material is sliced at an angle of from 45 to 80° with respect to the normal line from the primary sheet surface in the subsequent process. Therefore, the pressure or the tension that is applied to the primary sheet(s) during layering or rolling the same is adjusted such that it is not so large that the area of the cross section is not less than the intended area, or not so small that the sheets are not sufficiently bonded to each other.

A sufficient adhesiveness between the layered or rolled layers is usually obtained by adjusting the pressure or the tension. However, if the adhesiveness is insufficient, a molded material may be obtained by applying a solvent, an adhesive or the like onto the primary sheet to be layered or rolled. Further, if there is concern that the primary sheets may exfoliate at interfaces thereof upon application of stress applied depending on the slicing conditions, the molded material may be subjected to a heat treatment, and slicing may be carried out after obtaining a molded material in which the interfaces between the primary sheets are partially or fully cured. In that case, it is effective to sandwich the molded material between upper and lower metal plates that are heated, and apply a pressure so as not to cause deformation of the molded material. A thermal conductive sheet obtained from a molded material that has been subjected to a heat treatment (cured) before the slicing may not be subjected to a heat treatment in the subsequent process.

(Process (d))

Subsequently, a sliced sheet (base sheet) is obtained by slicing the molded material obtained in the process (c). A sliced sheet (base sheet) having a desired thickness is obtained by slicing the molded material at an angle of from 45 to 80°, and preferably from 55 to 70°, with respect to the normal line from the primary sheet plane. The angle for slicing is preferably determined such that the long axis of the anisotropic graphite powder (B) in the base sheet forms an angle of from 60 to 90° on average with respect to the surface of the base sheet (when the angle is 90° or more, a supplementary angle is used).

When the molded material has a layered structure, the slicing may be carried out at an angle within the above range, such that it is vertical or substantially vertical to a direction in which the primary sheets are layered.

When the molded material has a stacked structure, the slicing may be carried out at an angle within the above range, such that it is vertical or substantially vertical to the axis of rolling.

In a case of a molded material having a cylindrical column shape formed by layering primary sheets having a circular shape, the slicing may be carried out at an angle within the above range, along the circumference of the circular column.

The method of slicing is not particularly restricted, and examples include a multi blade method, a laser processing method, a water jet method, and a knife processing method. From the viewpoint of the accuracy of the thickness of the sliced sheet (base sheet) and the smoothness of the cut surface, a knife processing method is preferred.

The tool for slicing is not particularly restricted. For example, a slicing member having a portion like a plane, including a smooth board face having a slit and a blade projected from the slit, in which the length of the blade projecting from the slit is adjustable according to the thickness of the sliced sheet (base sheet), is suitably used because it does not tend to cause cracking of the binder component (A) near the surface of the obtained sliced sheet (base sheet) or disarrange the orientation of the anisotropic graphite powder (B), and it is easier to produce a sheet having a small thickness.

Specifically, the slicing member is preferably a plane or a slicer having a sharp blade. With the blade that is adjustable in its length projecting from the slit, a sliced sheet (base sheet) having an intended thickness can be readily obtained.

The temperature for slicing is adjusted according to the Tg (glass transition temperature) of the thermoplastic rubber component (D) and the amount and the particle size of the anisotropic graphite powder (B). The temperature is usually preferably in a range of from −50° C. to +50° C. at the surface of the molded material.

A molded material having a glass transition temperature of +50° C. or less is readily sliced due to the suppressed softness of the entire molded material. As a result, disorientation of the anisotropic graphite powder (B) is suppressed, and heat conductivity is favorable. When the slicing temperature is −50° C. or higher, the molded material is withheld from becoming hard and brittle, thereby suppressing cracking of the sliced sheet obtained immediately after the slicing.

The thickness of the sliced molded material is arbitrarily determined according to intended use or the like, and is preferably from 0.1 to 5 mm. When the thickness of the sliced molded material is 0.1 mm or more, it is easier to handle. When the thickness of the sliced molded material is 5 mm or less, it exhibits favorable heat conductivity.

(Process (e))

A thermal conductive sheet is obtained by providing (laminating) a metal foil (C) to one surface of the sliced sheet (base sheet) obtained in the process (d).

The type or the thickness of the metal foil (C) to be used is appropriately selected according to the intended use or the thickness of the sliced sheet (base sheet). A metal roll or a rubber roll is used as a laminator for the laminating process. The laminating temperature is from 0° C. to 120° C., and more preferably from 0° C. to 100° C. When the laminating temperature is 0° C. or more, adhesiveness between the base sheet and the metal foil is favorable, and delamination is less likely to occur. When the laminating temperature is 120° C. or less, disorder in the orientation of the anisotropic graphite powder is suppressed and a thermal conductive sheet that exhibits excellent heat transfer characteristics is obtained.

(Other)

As described above, the heat treatment for curing the binder component (A) may be carried out at any process of after the process (b), after the process (c), after the process (d), after the process (e), or after sandwiching the thermal conductive sheet between a heat source and a heat releasing material. When the heat treatment process is provided after the process (b), productivity is increased. When the heat treatment process is provided after the process (c), adhesion between the layered primary sheets is improved. When the heat treatment process is provided after the process (d), uniformity of the sliced sheet (base sheet) is improved. When the heat treatment process is provided after the process (e), adhesion between the sliced sheet (base sheet) and the metal foil (C) is improved. When the heat treatment process is provided after sandwiching the thermal conductive sheet between a heat source and a heat releasing material, adhesion between the heat source, the thermal conductive sheet and the heat source is improved.

<Heat Releasing Device>

The heat releasing device of the present invention has a structure in which the thermal conductive sheet of the present invention is interposed between a heat source and a heat releasing material.

The heat source, to which the thermal conductive sheet of the present invention is applied, preferably has an operating temperature that does not exceed 200° C. When the operation temperature is 200° C. or less, a rapid reduction in plasticity of the binder component (A) is suppressed and a reduction in heat releasing characteristics is suppressed. The suitable operation temperature is from −20 to 150° C., and examples of the suitable heat source include semiconductor packages, displays, LEDs and electric lights.

Representative examples of the heat releasing material include a heat sink utilizing a fin or a plate of aluminum or copper, a block of aluminum or copper that is connected to a heat pipe, a block of aluminum or copper in which a cooling liquid is circulated with a pump, a peltier device and a block of aluminum or copper provided with a peltiert device.

The heat releasing device of the present invention has a structure in which each of the surfaces of the thermal conductive sheet of the present invention is in contact with the heat source and the heat releasing material, respectively. The method of contacting and fixing the heat source, the thermal conductive sheet and the heat releasing material is not particularly restricted, as long as these elements can closely contact with each other. From the viewpoint of sustaining the adhesion, a method in which a pressure is maintained, such as a method of using screws via a spring or a method of using a clip, is preferred.

The entire disclosure of Japanese Patent Application No. 2010-138488 is incorporated by reference herein.

All publications, patent applications, and technical standards mentioned in this specification are herein incorporated by reference to the same extent as if each individual publication, patent application, or technical standard was specifically and individually indicated to be incorporated by reference.

EXAMPLES

In the following, the present invention is explained in detail with reference to the Examples. However, the present invention is not limited to the following Examples.

Example 1

(1) Preparation of Anisotropic Graphite Powder (Crushed Powder of Molded Sheet of Expanded Graphite)

A molded sheet of expanded graphite having a bulkiness density of 0.2 g/cm$^3$ (manufactured by Hitachi chemical Co., Ltd., trade name: CARBOFIT HGP-105) was crushed with a crusher (manufactured by Hosokawa Micron Group, trade name: ROTOPLEX), and the obtained crushed powder was classified with a vibrating screen, thereby obtaining 2 kg of an anisotropic graphite powder having a particle size distribution of from 500 to 1000 μm (crushed powder of expanded graphite sheet).

The obtained anisotropic graphite powder was observed with a SEM photograph, and it was confirmed that the anisotropic graphite powder had a dendritic shape.

(2) Preparation of Composition

A 1L-kneader equipped with a pressurizing system (manufactured by Yoshida Seisakusho Co., Ltd., trade name: 1100-S-1) was heated to 80° C. (barrel temperature), and 320 g of an acrylic rubber as the thermoplastic rubber component (D) (manufactured by Nagase ChemteX Corporation, trade name: HTR-811DR, weight average molecular weight: 500,000, glass transition temperature: −46° C., tackiness: large, exhibits elasticity at room temperature) and 250 g of the anisotropic graphite powder prepared in (1) were placed in the kneader and mixed for 10 minutes.

After the completion of mixing, 150 g of a phosphoric acid ester as a fire retardant (manufactured by Daihachi Chemical Industry Co., Ltd., trade name: CR-741 (viscosity: 2400 mPa·s (40° C.)) were mixed in the mixture in 4 steps over 20 minutes (5 minutes for each mixing).

Thereafter, 200 g of the remainder of the anisotropic graphite powder were added and mixed over 20 minutes, thereby preparing a composition. In the composition, the formulation amount of the anisotropic graphite powder, which was a heat releasing material, was 48.9% by mass of the total formulation amount.

The viscosity of the mixture as measured with a Mooney viscometer (manufactured by Ueshima Seisakusho Co., Ltd., trade name: VR-1130) was 25 (60° C.), 18 (80° C.) and 13 (100° C.). From these results, changes in the viscosity accompanied by changes in the temperature (temperature dependency) were confirmed from the measurement temperature as the horizontal axis and the viscosity as the vertical axis. There was a linear relationship between the temperature and the viscosity, which coincided with the trend of the Mooney viscosity of the thermoplastic rubber component (D) that was used (the values of the viscosity were different). From these results, it was determined that the dispersibility of the anisotropic graphite powder in the binder component (A) was favorable and the changes in the properties of the binder component (A) during mixing were small.

(3) Preparation of Primary Sheet

The primary sheet used for the molded material was obtained by the following processes.

First, 50 g of the composition as prepared above were sandwiched between 0.1 mm-thick PET films that had been subjected to a release treatment, and this was processed into a sheet having a thickness of approximately 3 mm with a pressing machine at normal temperature. The obtained processed sheet was allowed to pass through rolls heated to 80° C. (gap: 1.2 mm), whereby a primary sheet having a thickness after cooling of 1 mm was obtained. The density of the primary sheet was 1.4 g/cm$^3$.

(4) Layering Primary Sheets

The primary sheet prepared in (2) was cut into 50 sheets each having a size of 50 mm×250 mm along the roll direction, and a layered structure was obtained by layering the cut sheets in accord with the dimension.

Release paper sheets were applied to outermost surfaces of the layered structure, and this was placed on a hand press having a board surface heated to 50° C. Further, metal plates having a thickness of 4.5 mm were placed at both edges of the layered structure as a thickness adjuster. In this state, pressing was carried out for 5 minutes, thereby producing a molded material for slicing.

(5) Slicing Molded Material (Preparation of Base Sheet)

The molded material prepared in (3) was fixed on a self-made slicer produced by modifying a meat block slicer. After cooling the surface temperature of the molded material to −10° C., the molded material was sliced at a slide rate of the molded material of 60 mm/minute and a slicing angle of 30° with a single blade fixed on a platen, whereby a sliced sheet (base sheet) having a thickness of 0.25 mm was prepared.

Further, the cross section of the base sheet was observed with a SEM (scanning electron microscope), and angles between the long axes of any 50 particles of the anisotropic graphite powder and the surface of the base sheet were measured. The average value of the angles was 90°, which indicated that the anisotropic graphite powder is oriented in a thickness direction of the base sheet.

(6) Laminating Metal Foil

Subsequently, an aluminum foil having a thickness of 20 μm was placed on the base sheet and laminated with a metal roll with a temperature of 60° C., thereby preparing a thermal conductive sheet having a thickness of 0.25 mm.

The thicknesses of the base sheet and the metal foil (aluminum foil) were measured with a digital dial gauge (DEGIMATIC INDICATOR ID-C112C, manufactured by Mitutoyo Co., Ltd.), and the average values of values measured at any 5 points of the base sheet or the metal foil were defined as the thicknesses.

The thickness of the base sheet in the thermal conductive sheet having a thickness of 0.25 mm was 230 μm, and the thickness of the metal foil was 20 μm.

Example 2

A thermal conductive sheet was prepared in a similar manner to Example 1, except that the aluminum foil used in (6) was changed to a tin foil having a thickness of 20 μm.

Example 3

A thermal conductive sheet was prepared in a similar manner to Example 1, except that the composition prepared in (2) was changed to a composition prepared by the following processes.

(Preparation of Composition)

211 g of an acrylic rubber as the thermoplastic rubber component (D) (manufactured by Nagase ChemteX Corporation, trade name: HTR-811DR, weight average molecular weight: 500,000, glass transition temperature: −46° C., tackiness: large, exhibits elasticity at room temperature), 80 g of a solid carboxyl group-modified NBR that is solid at normal temperature (manufactured by ZEON Corporation, trade name: NIPPOL 1072, weight average molecular weight: 250,000, carboxyl group concentration: 0.75 (KOH mg/g) and 200 g of the anisotropic graphite powder prepared in (1) of Example 1 were placed into a kneader similar to that used in Example 1, and mixed for 10 minutes.

After the completion of the mixing, a mixture of 30 g of a liquid carboxyl group-modified NBR that is liquid at normal temperature (manufactured by ZEON Corporation, trade name: NIPPOL DN601, weight average molecular weight: 68,000, carboxyl group concentration: 0.75 (KOH mg/g)) and 150 g of a phosphoric acid ester as a fire retardant (manufactured by Daihachi Chemical Industry Co., Ltd., trade name: CR-741 (viscosity: 2400 mPa·s (40° C.)) was mixed in the mixture in 4 steps over 20 minutes (5 minutes for each mixing).

Thereafter, 262 g of the remainder of the anisotropic graphite powder were added and mixed for 20 minutes, and 11 g of an epoxy group-containing compound (manufactured by Shell Chemicals, trade name: EPIKOTE 828 (hereinafter, abbreviated as "Ep828"), number average molecular weight: 380, difunctional, number of epoxy groups (equivalent): 190 (liquid)) (10% by mass of the mass of the NBR used) as a thermosetting rubber curing agent (F) were added and mixed for 10 minutes, thereby preparing a composition.

In 100 parts by mass of the binder component of the obtained composition (total mass of the thermoplastic rubber component (D) and the thermosetting rubber component (E)), the acrylic rubber as the thermoplastic rubber component (D) was 65.7 parts by mass and the NBR as the thermosetting rubber component (E) was 34.3 parts by mass.

Further, in the composition, the formulation amount of the anisotropic graphite powder, which was a heat releasing material, was 48.9% by mass of the total formulation amount, and the Mooney viscosity of the mixture was 27 (60° C.), 20 (80° C.) and 15 (100° C.), respectively.

Example 4

A thermal conductive sheet was prepared in a similar manner to Example 1, except that the composition prepared in (2) of Example 1 was changed to a composition prepared by the following processes.

(Preparation of Composition)

170 g of an acrylic rubber (manufactured by Nagase ChemteX Corporation, trade name: HTR-811DR, weight average molecular weight: 500,000, glass transition temperature: −46° C., tackiness: large, exhibits elasticity at room temperature) as the thermoplastic rubber component (D) and 200 g of the anisotropic graphite powder prepared in (1) of Example 1 were placed in a kneader similar to that used in Example 1, and mixed for 10 minutes.

A mixture of 150 g of a phosphoric acid ester as a fire retardant (manufactured by Daihachi Chemical Industry Co., Ltd., trade name: CR-741 (viscosity: 2400 mPa·s (40° C.)) and 150 g of polybutene as a plasticizer (manufactured by NOF Corporation, trade name: 200N) was mixed in the mixture in 4 steps over 20 minutes (5 minutes for each mixing).

Thereafter, 150 g of the remainder of the anisotropic graphite powder were added and mixed for 20 minutes, thereby prep4 steps aring a composition.

In the composition, the formulation amount of the anisotropic graphite powder, which was a heat releasing material, was 48.9% by mass of the total formulation amount, and the Mooney viscosity of the mixture was 22 (60° C.), 17 (80° C.) and 12 (100° C.), respectively.

Example 5

A thermal conductive sheet was prepared in a similar manner to Example 1, except that the aluminum foil used in (6) of Example 1 was changed to a copper foil having a thickness of 20 μm.

Comparative Example 1

A thermal conductive sheet was prepared in a similar manner to Example 1, except that the aluminum foil used in (6) of Example 1 was not laminated.

<Evaluation of Thermal Conductive Sheet>

Sheet characteristics of the thermal conductive sheets prepared in Examples 1 to 4 and Comparative Example 1 were evaluated in the following manner. The results are shown in Table 1. The heat transfer characteristic was evaluated by the value of thermal resistance of the sheet.

[Thermal Resistance]

A test sheet having the size of 1 cm in length×1.5 cm in width was prepared from the obtained thermal conductive sheet, and the test sheet was interposed between a transistor (2SC2233) and an aluminum heat releasing block. A current was applied while applying a pressure of 0.5 MPa to the transistor. The temperature of the transistor: $T1$ (° C.) and the temperature of the heat releasing block: $T2$ (° C.) were measured. From the measured value and the applied electricity: $W1(W)$, the thermal resistance: $X$ (° C./W) was calculated according to the following Formula (1).

$$X=(T1-T2)/W1 \quad \text{Formula (1)}$$

The thermal conductivity: $Tc$ (W/mK) was estimated according to the following Formula (2) from the thermal resistance: $X$ (° C./W) of Formula (1), the thickness of the thermal conductive sheet: $d$ (μm) and the correction coefficient based on a sample whose thermal conductivity was known: $C$ (measured at a room temperature of 23° C.).

$$Tc=C\times d/X \quad \text{Formula (2)}$$

[Resilience]

Two test sheets of 20 mm×40 mm and two test sheets of 20 mm×30 mm were prepared from the obtained thermal conductive sheet, respectively. According to the measurement device and the measurement method described on pages 9 to 10 of JASO M303-95 (automobile regulation: non-metallic gasket materials: published by Society of Automotive Engineers in Japan, Inc. (1995)), a heat treatment was carried out at 150° C./1 hour with a bolt extension before heating Do (mm) of 0.018 mm, and then cooled. The bolt extension after cooling Df (mm) was measured and a stress relaxation rate was calculated by the following Formula (3).

Stress relaxation rate (%)=(Do−Df)/Do×100    Formula (3)

[Evaluation of Handleability]
(Longitudinal Direction)
A test sheet of 20 mm×40 mm was prepared from the obtained thermal conductive sheet, and the tensile strength of the test sheet in a longitudinal direction (direction of 90° with respect to the layered plane) was measured with an autograph at a room temperature of 23° C.
(Layered Direction)
A test sheet of 20 mm×40 mm was prepared from the obtained thermal conductive sheet, and the tensile strength of the test sheet in a layered direction was measured in a similar manner to the measurement of the tensile strength in a longitudinal direction.

[Tackiness]
Tackiness of the sheet surface was measured with a tackiness tester (TAC-II, manufactured by RHESCA Corporation, probe diameter: 5.1 mm) at 20 to 30° C. under the conditions of rate of pushing: 120 mm/minute, rate of pulling: 600 mm/minute, probe contact load: 50 gf and probe contact time: 10 seconds.

[Flame Retardant]
A vertical burning test was carried out in accordance with the UL standards, based on JIS Z 2391 (1999). The size of the test sheet was 125×13 mm. The test sheets of acceptable level were rated as V0 , which indicates the highest flame retardant, V1, V2 and HB in decreasing order.

TABLE 1

| Test Items | Example 1 | Example 2 | Example 3 | Example 4 | Example 5 | Comp. Example 1 |
|---|---|---|---|---|---|---|
| Base sheet Thickness S [mm] | 0.23 | 0.23 | 0.23 | 0.23 | 0.23 | 0.25 |
| Metal Foil Thickness M [μm] | 20 | 20 | 20 | 20 | 20 | 0 |
| M/S [%] | 9 | 9 | 9 | 9 | 9 | 0 |
| Thermal Resistance [° C. · cm$^2$/W] | 0.07 | 0.05 | 0.08 | 0.07 | 0.09 | 0.04 |
| Resiliency [%] (Stress Relaxation) | 20 | 20 | 35 | 20 | 20 | 20 |
| Handleability (tensile strength) [MPa] Longitudinal | 7.0 | 2.4 | 7.0 | 7.0 | 32 | 0.05 |
| Handleability (tensile strength) [MPa] Layered | 7.0 | 2.4 | 7.0 | 7.0 | 32 | 0.01 |
| Tackiness [gf] | 150 | 155 | 100 | 200 | 150 | 95 |
| Flame Retardant (UL-94) | V-0 | V-0 | V-0 | V-0 | V-0 | V-0 |

As shown in Table 1, the thermal conductive sheet of Examples 1 to 5, having a base sheet including a binder component (A) that exhibits elasticity at room temperature and an anisotropic graphite powder (B), in which the anisotropic graphite powder (B) is oriented in a thickness direction, and a metal foil (C) having a thickness of 1 to 30% of the thickness of the base sheet, exhibit favorable results in heat transfer characteristic (thermal resistance), handleability (strength, tackiness and flame retardant) and shape processability into a sheet (resiliency (stress relaxation).

Example 6, Example 7, Example 8 and Comparative Example 2

Thermal conductive sheets were prepared in a similar manner to Example 1, except that the thickness of the aluminum foil used in (6) of Example 1 was changed as shown in Table 2. The sheet characteristics of the obtained thermal conductive sheets were evaluated according to the methods as described above. The results are shown in Table 2.

TABLE 2

| Test Items | Example 6 | Example 7 | Example 8 | Comp. Example 2 |
|---|---|---|---|---|
| Base sheet Thickness S [mm] | 0.245 | 0.21 | 0.2 | 0.15 |
| Metal Foil Thickness M [μm] | 5 | 42 | 50 | 100 |
| Thermal Resistance [° C. · cm$^2$/W] | 0.07 | 0.10 | 0.15 | 0.5 |
| Resiliency [%] (Stress Relaxation) | 20 | 18 | 18 | 10 |
| Handleability (tensile strength) [MPa] Longitudinal | 1.3 | 15 | 17 | 32 |
| Handleability (tensile strength) [MPa] Layered | 1.3 | 15 | 17 | 32 |
| Tackiness [gf] | 150 | 140 | 130 | 120 |
| Flame Retardant (UL-94) | V-0 | V-0 | V-0 | V-0 |

As shown in Table 2, the thermal conductive sheets of Examples 6 to 8, including a metal foil having a thickness of 1 to 30% with respect to the thickness of the base sheet, exhibit favorable results in heat transfer characteristic (thermal resistance), handleability (strength, tackiness and Flame retardant) and shape processability into a sheet (resiliency (stress relaxation). On the other hand, the thermal conductive sheet of Comparative Example 2, including a metal foil having a thickness of greater than 30% with respect to the thickness of the base sheet, is inferior to the thermal conductive sheets of the Examples in terms of thermal resistance and resiliency (stress relaxation). Further, the thermal conductive sheet of Comparative Example 1, not including a metal foil (i.e. the thickness of the metal foil is less than 1%), is inferior to the thermal conductive sheets of the Examples in terms of handleability (strength and tackiness).

The invention claimed is:
1. A thermal conductive sheet comprising:
   a base sheet that comprises a binder component that exhibits elasticity at room temperature and a graphite powder that has anisotropy, the graphite powder being oriented in a thickness direction; and
   a metal foil that has a thickness of from 1 to 30% of a thickness of the base sheet, the metal foil being positioned on one surface of the base sheet.

2. The thermal conductive sheet according to claim 1, wherein the metal foil is formed from aluminum, copper or tin.

3. The thermal conductive sheet according to claim 1, comprising, as the binder component, a thermoplastic rubber component that has a glass transition temperature of 50° C. or less.

4. The thermal conductive sheet according to claim 1, comprising, as the binder component, a thermoplastic rubber component that has a glass transition temperature of 50° C. or less, a thermosetting rubber component, and a thermosetting rubber curing agent that is crosslinkable with the thermosetting rubber component.

5. The thermal conductive sheet according to claim 1, wherein the graphite powder is a powder obtained by crushing a molded sheet of expanded graphite, and wherein a bulk density of the molded sheet of expanded graphite before crushing is in a range of from 0.1 g/cm$^3$ to 1.5 g/cm$^3$.

6. The thermal conductive sheet according to claim 1, wherein the graphite powder has a flat and acicular shape or a dendritic shape, and has an average particle size of from 50 μm to 2000 μm.

7. The thermal conductive sheet according to claim 1, further comprising a phosphoric acid ester.

8. The thermal conductive sheet according to claim 1, wherein the metal foil is laminated on the base sheet.

* * * * *